United States Patent
Jung et al.

(10) Patent No.: US 8,861,294 B2
(45) Date of Patent: Oct. 14, 2014

(54) STORAGE CELL BRIDGE SCREEN TECHNIQUE

(75) Inventors: TaeHyung Jung, Santa Clara, CA (US); KeeSoo Kim, Cheong-ju (KR)

(73) Assignee: SK hynix Inc., Icheon-si (KR)

( * ) Notice: Subject to any disclaimer, the term of this patent is extended or adjusted under 35 U.S.C. 154(b) by 280 days.

(21) Appl. No.: 13/540,227

(22) Filed: Jul. 2, 2012

(65) Prior Publication Data

US 2014/0003175 A1    Jan. 2, 2014

(51) Int. Cl.
*G11C 7/00* (2006.01)
(52) U.S. Cl.
USPC .. 365/201; 365/207; 365/230.03; 365/230.06
(58) Field of Classification Search
CPC ........ G11C 7/00; G11C 7/02; G11C 11/4074; G11C 7/062; G11C 7/1048; G11C 7/22
USPC ............ 365/201, 205, 207, 203, 208, 230.05, 365/230.06, 230.09, 230.03
See application file for complete search history.

(56) References Cited

U.S. PATENT DOCUMENTS

| 6,961,282 | B2 | 11/2005 | Son |  |
|---|---|---|---|---|
| 2007/0183232 | A1 | 8/2007 | Okada |  |
| 2009/0303818 | A1* | 12/2009 | Kim | ............................ 365/201 |
| 2010/0128544 | A1* | 5/2010 | Kim et al. | ..................... 365/201 |

FOREIGN PATENT DOCUMENTS

| KR | 10-2002-0011213 | 2/2002 |
| KR | 10-2006-0031392 | 4/2006 |
| KR | 10-2008-0011917 | 2/2008 |

* cited by examiner

*Primary Examiner* — Hien Nguyen
(74) *Attorney, Agent, or Firm* — Kilpatrick Townsend & Stockton LLP

(57) ABSTRACT

A semiconductor memory includes a circuit block that is configured to receive a test mode command, a first sense amplifier that is coupled to sense and amplify a state of a first memory cell when enabled, and a second sense amplifier that is coupled to sense and amplify a state of a second memory cell when enabled. In an active cycle, the circuit block generates one or more control signals in response to the test mode command that cause the second sense amplifier to be enabled a predetermined amount of time after the first sense amplifier is enabled.

22 Claims, 7 Drawing Sheets

STORAGE CELL BRIDGE SCREEN TECHNIQUE

BACKGROUND OF THE INVENTION

As semiconductor memory technology continues to advance and the size of memory cells continues to shrink, problems associated with bridges formed during the manufacturing process between neighboring memory cells (e.g., due to manufacturing defects such as conductive particles) become more pronounced. Such bridges create resistive shorts between neighboring memory cells that can cause the memory device to malfunction. Severe ridges between neighboring memory cells can be detected during testing of memory devices and addressed, for example, using row and/or column redundancy techniques. However, if the bridge results in a more resistive short, detection of such bridge during the wafer or package test becomes more difficult. Often, such undetected bridges result in premature failure of the part in the field.

A number of techniques for detecting bridges have been proposed. However, all these techniques require complex test algorithms and/or extensive on-chip circuitry which lengthen the test time and/or increase the die size. Thus, there is a need for a simple detection technique that can successfully detect even small leakages due to bridges between adjacent cells using simple circuitry and without increasing the test time.

BRIEF SUMMARY OF THE INVENTION

In accordance with an exemplary embodiment, a method for detecting a bridge between two memory cells in a memory array includes receiving a test mode command, and in response to an active command, enabling a first sense amplifier and a second sense amplifier for respectively sensing a state of a first memory cell and a second memory cell. The first and second memory cells are adjacent one another, and the test mode command causes the second sense amplifier to be enabled a predetermined amount of time after the first sense amplifier is enabled.

In one embodiment, the predetermined amount of time allows the detection of a bridge between the first and second memory cells.

In another embodiment, in a normal mode of operation, the first and second sense amplifiers are enabled at substantially the same time.

In another embodiment, a first bitline couples the first memory cell to the first sense amplifier, and a second bitline couples the second memory cell to the second sense amplifier. Prior to receiving the active command, the first and second bitlines are precharged to a precharge voltage level.

In another embodiment a wordline is selected in response to the active command, and each of the first and second memory cells has a gate connected to the selected wordline. In response to the selection of the wordline, the first memory cell causes the first bitline to have a first voltage level, and the second memory cell causes the second bitline to have a second voltage level, the first and second voltage levels being opposite one another relative to the precharge voltage level.

In yet another embodiment, during the time period between enabling the first and second sense amplifiers, a voltage difference between a voltage level on the first bitline and the precharge voltage level is increased, and a voltage difference between the voltage level on the second bitline and the precharge voltage level is reduced if a bridge between the first and second memory cells is present.

In still another embodiment, the memory array is housed in a memory device and the predetermined amount of time is controlled external to the memory device, and in an alternate embodiment, the predetermined amount of time is internally selected from a number of preset delays.

In accordance with another embodiment, a semiconductor memory includes a memory array having a plurality of memory cells coupled to wordlines and bitlines, a circuit block configured to receive a test mode command, a first sense amplifier coupled to sense and amplify a state of a first memory cell when enabled, and a second sense amplifier coupled to sense and amplify a state of a second memory cell when enabled. The first and second memory cells are adjacent one another. In an active cycle, the circuit block generates one or more control signals in response to the test mode command that cause the second sense amplifier to be enabled a predetermined amount of time after the first sense amplifier is enabled.

In one embodiment, a first bitline couples the first memory cell to the first sense amplifier, a second bitline couples the second memory cell to the second sense amplifier, and prior to the active cycle, the first and second bitlines are precharged to a precharge voltage level.

In another embodiment, the first and second memory cells are connected to a wordline which is selected in the active cycle, and in response to the selection of the wordline, the first and second memory cells cause the first and second bitlines to respectively have first and second voltage levels opposite one another relative to the precharge voltage level.

In yet another embodiment, during the time period between enabling the first and second sense amplifiers, the first sense amplifier causes a voltage difference between a voltage level on the first bitline and the precharge voltage level to increase, and a voltage difference between the voltage level on the second bitline and the precharge voltage level is reduced if a bridge between the first and second memory cells is present.

In still another embodiment, the semiconductor memory is housed in a memory device and the predetermined amount of time is controlled external to the memory device. In an alternate variation, the predetermined amount of time is internally selected from a number of preset delays.

DETAILED DESCRIPTION OF THE INVENTION

Figure 1A:
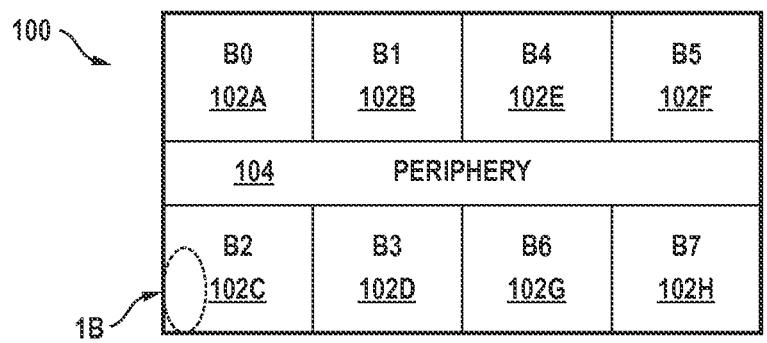
FIG. 1A shows a top view of a memory device 100.

Bridges between neighboring memory cells in a memory device are detected using a simple but highly effective technique. For illustration purposes only, the bridge screen technique is briefly described in the next paragraph in the context of what is named herein as the "odd bitline stress" condition. Under the "odd bitline stress condition," a bridge between two neighboring memory cells, one of which is connected to an odd bitline and the other one connected to an even bitline, is detected by causing the even bitline to have a higher potential than the neighboring odd bitline thus causing the odd bitline to lose its potential through the conductive bridge between the two neighboring memory cells. It is noted that the bridge screen technique described herein is equally effective in the context of an "even bitline stress" condition where an odd bitline is caused to have a higher voltage level than a neighboring even bitline.

During testing, a known data pattern is written into the memory device. A bridge screen test command is provided to the memory device to place the device in the bridge screen test mode. An active command is provided to the memory device, and a wordline is selected in response to the active command. The data stored in the memory cells connected to the selected wordline are coupled to corresponding bitlines. The voltage at each of the bitlines changes from a precharge voltage level to a first voltage level intermediate the precharge level and a logic high level, or to a second voltage level intermediate the precharge level and a logic low level depending on the data stored in the memory cells. It is assumed that those memory cells along the selected wordline that are connected to even bitlines store a "1," and those memory cells along the selected row that are connected to odd bitlines store a "0," which corresponds to the "odd bitline stress" condition. A predetermined time period after the wordline selection, even sense amplifiers connected to the even bitlines are activated to sense and amplify the first voltage level on the event bitlines to a logic high level. A predetermined time period after enabling the even sense amplifiers, the odd sense amplifiers are activated to sense and amplify the second voltage level on the odd bitlines. During the time period between enabling the even and odd sense amplifiers, the voltage on all even bitlines is strongly biased to the logic high level by the even sense amplifiers, while the odd bitlines are weakly biased to the second voltage level by the corresponding memory cells. If a bridge exists between two neighboring memory cells along the selected wordline, because the two memory cells have opposite data, the weakly maintained potential on the odd bitline starts to rise toward the strongly biased high logic level on the even bitline. As a result, when the odd sense amplifier is enabled after the delay generated by the bridge screen test command, the sense amplifier detects the opposite data to that stored in the memory cell connected to the odd bitline, and thus the wrong data appears at the output of the memory device indicating the presence of a bridge. Sufficient time delay needs to be provided between enabling the even and odd sense amplifiers to ensure that low leakage bridges can be detected while avoiding detection of low level leakages that are commonly present in memory arrays.

This technique advantageously minimizes the required time delay between enabling the even and odd sense amplifiers for detecting even low leakage bridges. This is because unlike conventional detection techniques, the bitlines that are sensed first (the even bitlines in the above example) provide a strongly biased high voltage level capable of more quickly moving the weakly held voltage level on the bitlines that are sensed later (the odd bitlines in the above example). Additionally, unlike the conventional detection techniques where multiple active and precharge cycles are required for detecting a bridge, the above-described technique detects a bridge using one active cycle. Moreover, because of the simplicity of the technique, the silicon overhead for the bridge screen detection circuit is minimal and the testing time associated with the bridge screed detection is substantially reduced compared to known techniques. Next, the bridge screen technique is described in detail using an exemplary implementation.

Figure 1B:
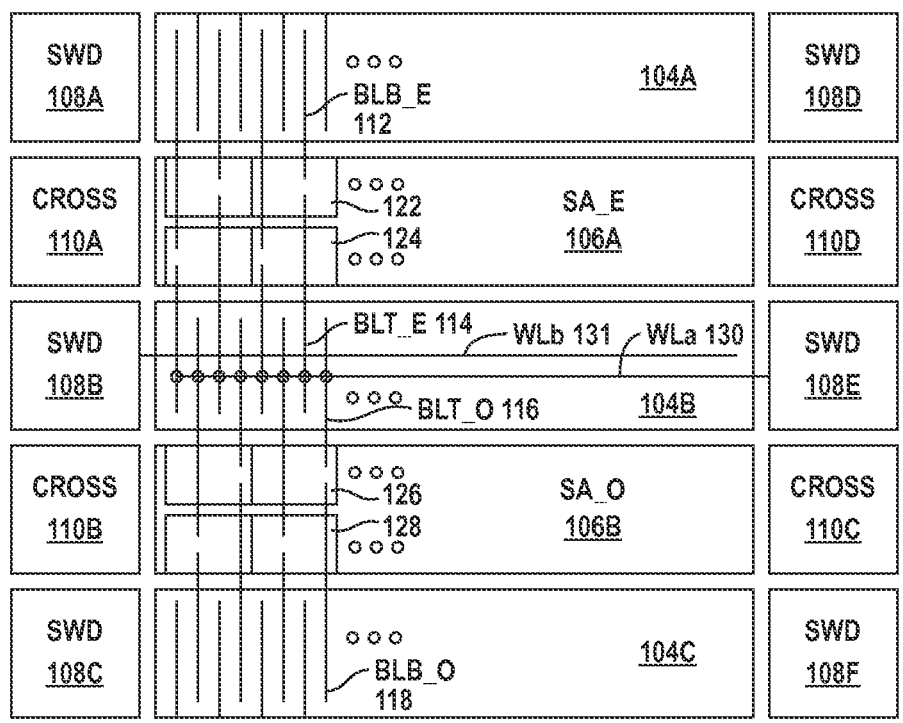
FIG. 1B shows in more detail a portion of one of the memory banks in FIG. 1A.

FIGS. 1A-1C, 2, 3, 4A-4B, 5, and 6 will be used to describe an exemplary embodiment in which the above-described technique is implemented. FIG. 1A shows a top view of a memory device 100. Memory device 100 includes eight memory banks B0-B7 respectively marked with reference numerals 102A-102H. The top four banks are separated from the bottom four banks by periphery area 104 where the peripheral circuitry is housed. FIG. 1B shows in more detail a portion of one of the memory banks. In FIG. 1B, three memory arrays (or mats) 104A, 104B and 104C are separated by even and odd sense amplifier blocks SA_E 106A and SA_O 106B. Memory array 104A is coupled to a left sub-wordline driver SWD 108A and a right sub-wordline driver SWD 108D. Similarly, memory array 104B is coupled to a left sub-wordline driver SWD 108B and a right sub-wordline driver SWD 108E, and memory array 104C is coupled to a left sub-wordline driver SWD 108C and a right sub-wordline driver SWD 108F. The wordlines in each memory array 104A, 104B and 104C are alternately driven by corresponding right and left sub-wordline drivers as illustrated by wordlines WLa 130 and WLb 131 in memory array 104B.

Each of even sense amplifier block SA_E 106A and odd sense amplifier block SA_O 106B includes an upper row of amplifier circuits (e.g., circuits 122, 126) and a lower row of amplifier circuits (e.g., circuits 124, 128). In SA_E 106A, upper sense amplifier circuit 122 receives even bitline BLB_E 112 from array 104A and bitline BLT_E 114 from array 104B, and amplifies the signal differential between these two bitlines when enabled. Similarly, in SA_O 106B, upper sense amplifier circuit 126 receives bitline BLB_O 118 from memory array 104C and bitline BLT_O 116 from memory array 104B, and amplifies the signal differential between these two bitlines when enabled. As an example, in an active cycle, if wordline WLa 130 in array 104B is selected by right sub-wordline driver SWD 108E, all sense amplifier circuits in both even and odd sense amplifier blocks SA_E 106A and SA_O 106B are enabled so that the data in all the memory cells along the selected wordline WLa 130 are sensed and amplified. Blocks 110A-110D marked as CROSS house control circuitry that drive sense amplifier circuits in the even and odd sense amplifier blocks SA_E 106A and SA_O 106B.

Figure 1C:
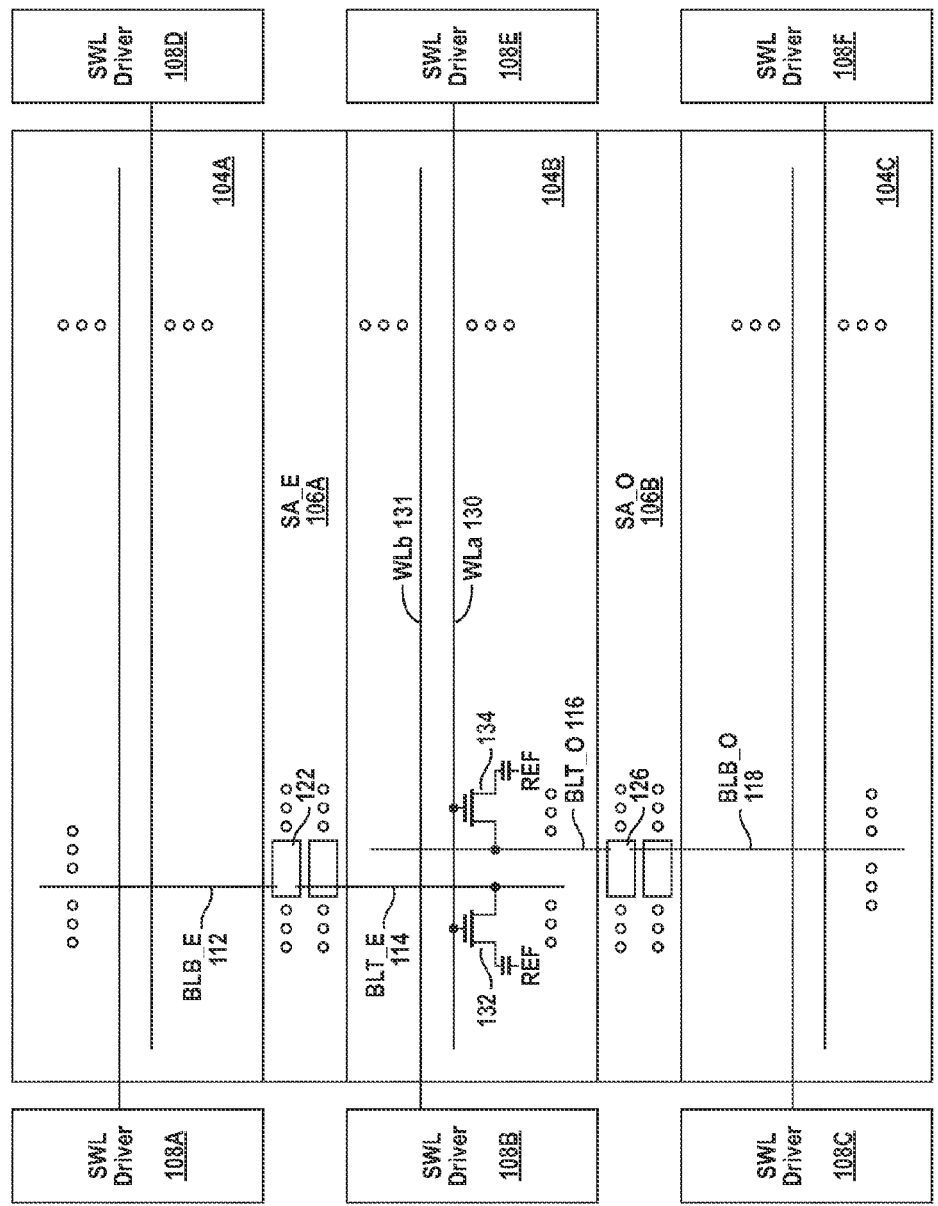
FIG. 1C is a simplified top view diagram showing some details of the diagram in FIG. 1B.
Figure 2:
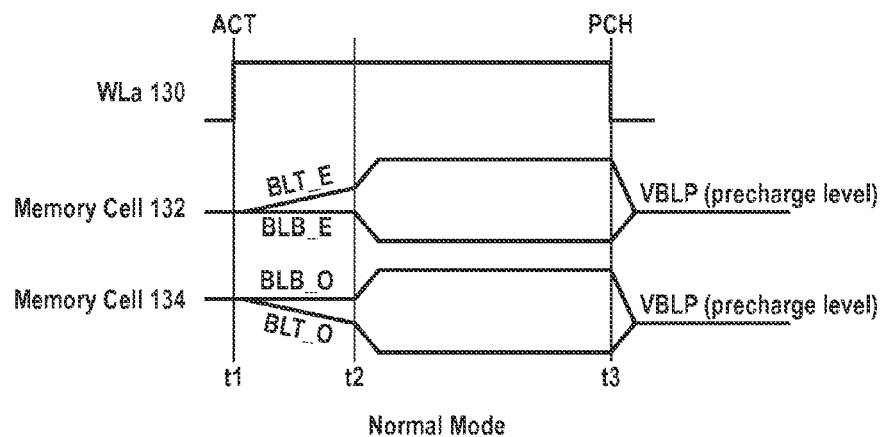
FIG. 2 is a timing diagram showing waveforms for wordline and bitline signals in an active cycle in a normal mode of operation.
Figure 3:
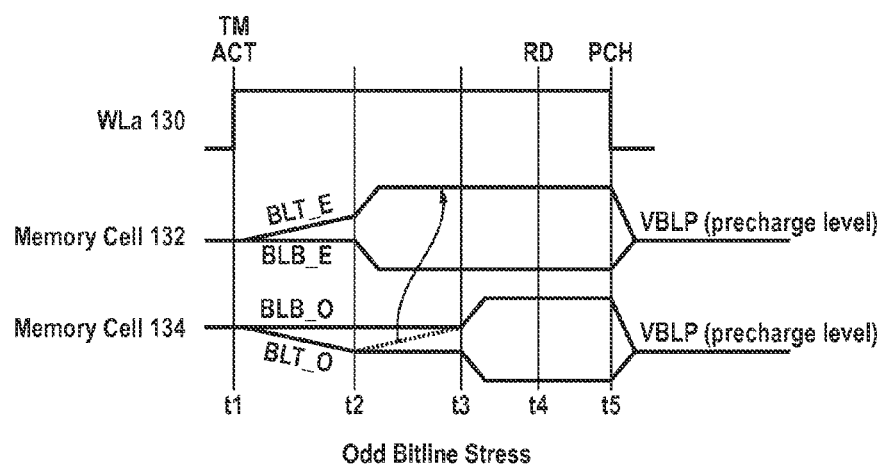
FIG. 3 is a timing diagram showing waveforms for the same wordline and bitline signals as in FIG. 2 in an active cycle but in a test mode TM instead of a normal mode.

FIG. 1C is a simplified top view diagram corresponding to FIG. 1B, and it will be used in conjunction with the timing diagrams shown in FIGS. 2 and 3 to illustrate the bridge screening technique. In FIG. 1C, two neighboring memory cells 132 and 134 connected to wordline WLa 130 are shown. These two memory cells represent two of a 1024 memory cells connected to each of 512 wordlines in each of memory arrays (or mats) 104A, 104B and 104C. The memory cells are of the DRAM variety though the invention is not limited to this type of memory technology. As can be seen, each memory cell includes an access transistor (e.g., an NMOS transistor) with its gate connected to a wordline, its drain connected to a bitline and its source connected to one plate of a storage capacitor. The other plate of the storage capacitor is connected to a reference potential such as the ground potential.

FIG. 2 is a timing diagram showing particular wordline and bitline signals in an active cycle in a normal mode, and FIG. 3 is a timing diagram showing the same wordline and bitline signals in an active cycle in a test mode TM. In the normal mode (FIG. 2), prior to receiving an active command ACT, all bitlines are in a precharge state and are thus biased to precharge level VBLP. Upon receiving the active command ACT, wordline WLa 130 is selected via right SWL driver 108E at time t1. For purposes of illustration, it is assumed that a "1" is stored in memory cell 132, and a "0" is stored in memory cell 134. Subsequent to selection of WLa 130, the access transistor of all the memory cells along wordline WLa 130 are turned on and the storage capacitors are coupled to corresponding bitlines. With a "1" stored in the storage capacitor of memory cell 132, even bitline BLT_E 114 is raised high by the charge stored in the capacitor. With a "0" stored in the storage capacitor of memory cell 134, bitline BLT_O 116 is pulled low by the capacitor.

At time t2, the sense amplifier circuits in the even and odd sense amplifier blocks SA_E 106A and SA_O 106B are enabled to allow the sense amplifier circuits to sense and amplify the signals on corresponding bitlines in memory array 104B. The sense amplifier circuits do so by amplifying the signal differential between the bitlines in array 104B and corresponding bitlines in arrays 104A and 104C which remain at precharge voltage level VBLP during the sensing phase. For example, sense amplifier circuit 122 amplifies the signal differential between the rising signal on even bitline BLT_E 114 and the precharge level on BLB_E 112. As illustrated in FIG. 2, sense amplifier circuit 122 amplifies this signal differential to a much larger signal differential, and provides the logic high level (corresponding to the stored "1" data) at its output. Similarly, sense amplifier circuit 126 amplifies the signal differential between the falling signal on BLT_O 116 and the precharge level on BLB_O 118 to a larger signal differential, and provides the logic low level (corresponding to the stored "0" data) at its output. In FIG. 2, at time t3, in response to a precharge command PCH, all bitlines are precharged to VBLP in preparation for the next command. The memory device may receive a different command than PCH at t3.

The timing diagram in FIG. 3 shows the timing sequence for performing the bridge screening test. As shown, upon providing a test mode command TM and an active command ACT, the memory device is put into a test mode and wordline WLa 130 is selected at time t1. Assuming the same data is written into memory cells 132 and 134 as that described above with reference to the normal mode operation (FIG. 2), signals are developed on the various bitlines in a similar manner to that described above. However, in contrast to the normal mode where the even and odd sense amplifier blocks SA_E 106A and SA_O 106B are enabled at the same time (time t2), in the test mode, the sense amplifier circuits in the even sense amplifier block SA_E 106A are enabled at time t2 but the sense amplifier circuits in the odd sense amplifier block SA_O 106B are enabled later at time t3.

During the time period between t2 and t3, the voltage on all even bitlines in memory array 104B (e.g., BLT_E 114) is strongly biased to the high logic level by the even sense amplifier circuits (e.g., circuit 122) in even sense amplifier block SA_E 106A. During the same time period, the odd bitlines in memory array 104B (e.g., BLT_O 116) would settle at a potential between the precharge voltage level VBLP and the low logic level as dictated by the charge sharing between the storage capacitor and the capacitance of the bitline to which the storage capacitor is coupled. However, if a bridge exists between any two adjacent cells along the selected wordline WLa 130, because such two memory cells have opposite data, the weakly held voltage on the odd bitline (e.g., BLT_O 116) starts rising toward the more strongly biased high logic level on the even bitline (e.g., BLT_E 114). This is illustrated in FIG. 3 by the dashed line that ramps up between t2 and t3. The dashed arrow in FIG. 3 symbolizes the bridge between BLT_O 116 and BLT_E 114. The rate at which the potential on BLT_O 116 rises depends on how resistive the bridge is. The more resistive the bridge, the slower would be the rate at which the potential on BLT_O 116 rises. Sufficient time delay needs to be provided between enabling the even and odd sense amplifiers to ensure that low leakage bridges can be detected. However, too long a time delay can lead to what is known as overkill problem, namely, incorrectly detecting the small cell or bitline leakage commonly present in memory arrays as the bridge leakage. Providing the flexibility to adjust the time delay after wafer processing advantageously ensures that the right amount of time delay can be provided without running into the overkill problem.

At time t3, if the voltage on BLT_O 116 has reached or risen above the precharge level VBLP, the odd sense amplifier circuit 126 senses the opposite data to that stored in memory cell 134, and thus at time t4 when the data is read, the wrong data appears at the output of the memory device indicating the presence of a bridge. At time t5, the active cycle and the test mode are terminated, and a precharge cycle starts upon receipt of the PCH command.

Figure 4A:
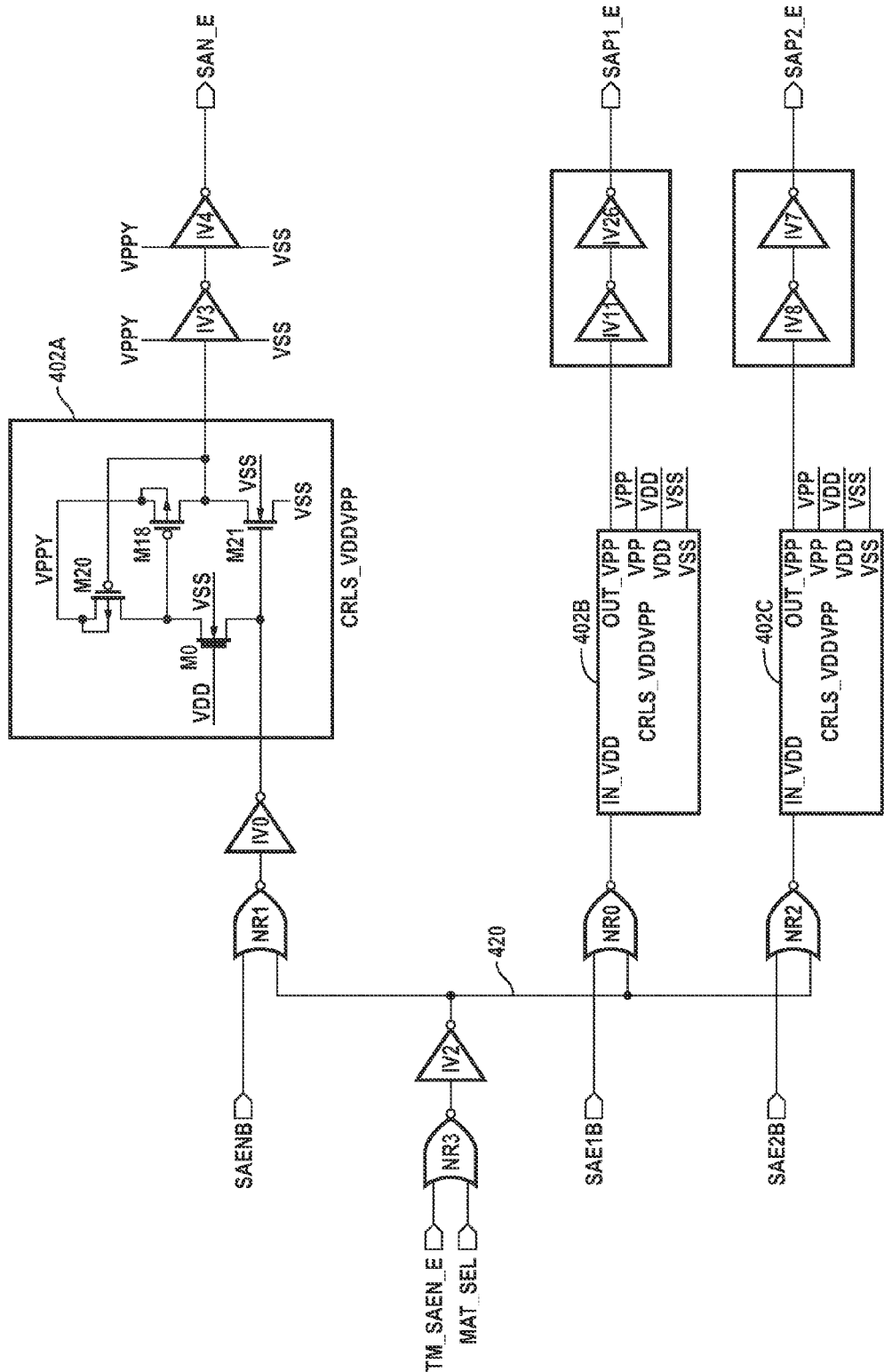
FIGS. 4A and 4B show an exemplary logic implementation for the bridge screen test.
Figure 4B:
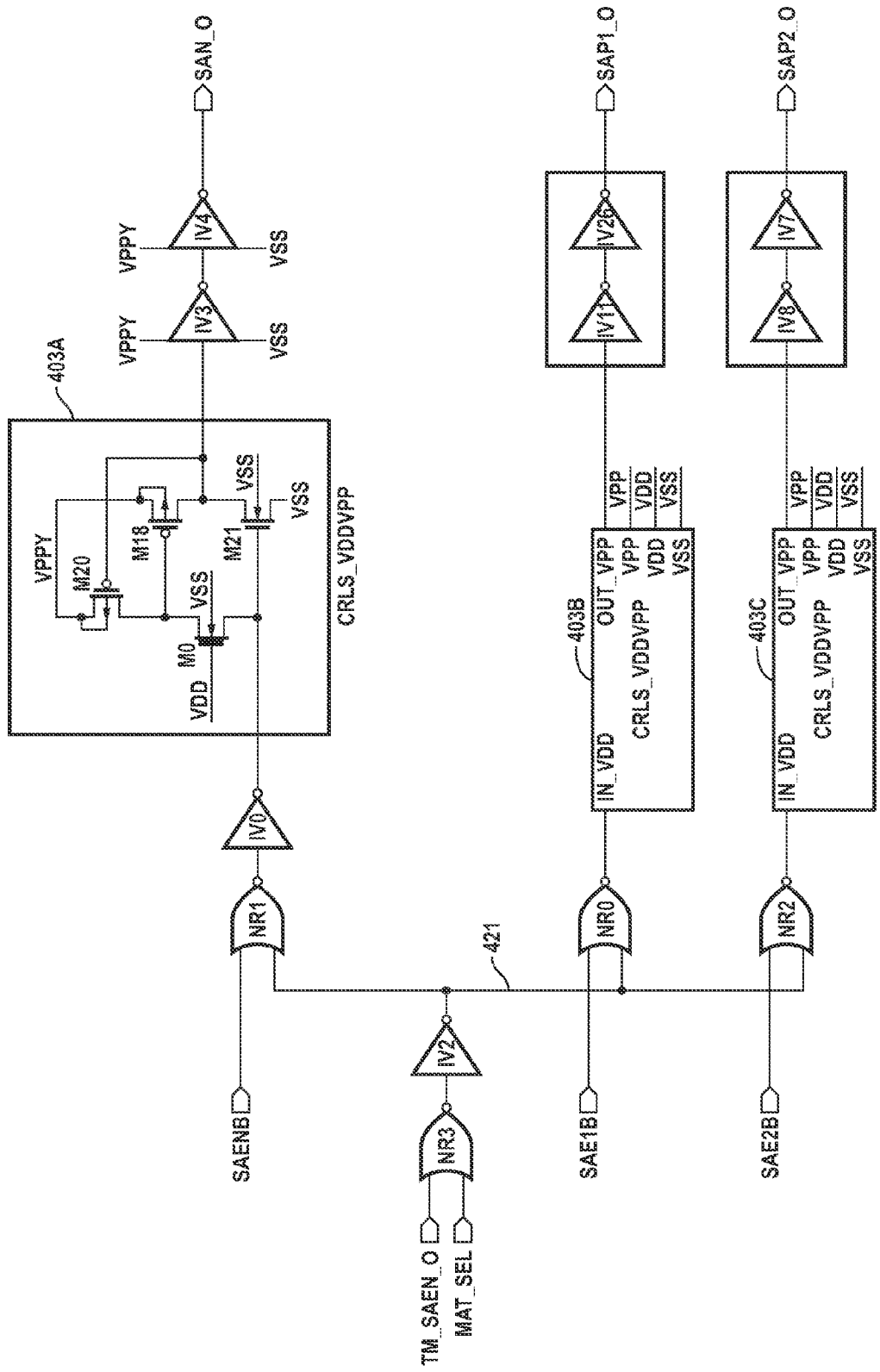
Figure 5:
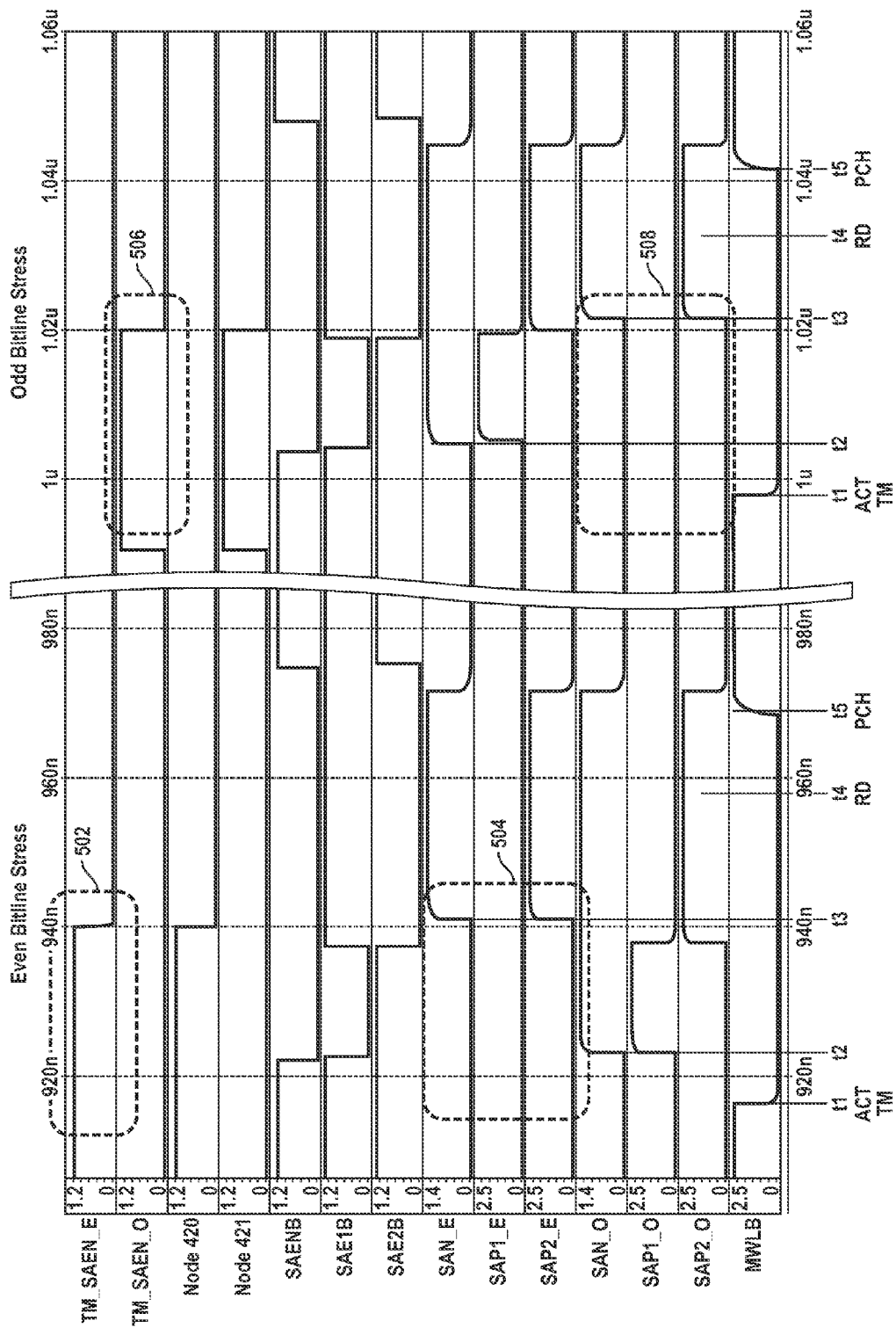
FIG. 5 shows a timing diagram for the logic circuit in FIGS. 4A and 4B.

FIGS. 4A and 4B show an exemplary logic implementation for the bridge screen test described above, and FIG. 5 is a timing diagram showing various signals in the FIGS. 4A and 4B circuits. The logic circuits in FIGS. 4A and 4B respectively generate control signals for controlling the operation of the even sense amplifier blocks SA_E and odd sense amplifier blocks SA_O in FIG. 1B. The FIG. 4A circuit receives even test mode sense enable control signal TM_SAEN_E, mat selection signal MAT_SEL, sense amp enable signals SAENB, SAE1B and SAE2B, and in response generates even sense amplifier control signals SAN_E, SAP1_E and SAP2_E. The FIG. 4B circuit receives odd test mode sense enable control signal TM_SAEN_O, mat selection signal MAT_SEL, sense amp enable signals SAENB, SAE1B and SAE2B, and in response generates odd sense amplifier control signals SAN_O, SAP1_O and SAP2_O. The timing diagram in FIG. 5 shows waveforms corresponding to each of the input and output signals in FIGS. 4A and 4B for two active cycles in which the bridge screen test is activated. FIG. 5 also shows the waveforms for the signals at intermediate nodes 420 (FIG. 4A) and 421 (FIG. 4B). In the first active cycle which corresponds to an "even bitline stress" condition, the even sense amplifier signals generated by the FIG. 4A circuit are delayed relative to the odd sense amplifier signals generated by the FIG. 4B circuit. In the second active cycle which corresponds to an "odd bitline stress" condition, the odd sense amplifier signals generated by the FIG. 4B circuit are delayed relative to the even sense amplifier signals generated by the FIG. 4A circuit.

In FIG. 5, the markings t1-t5 along the time scale for each of the first and second active cycles correspond to the markings t1-t5 in FIG. 3. In FIG. 5, the second active cycle ("odd bitline stress" condition) corresponds to the active cycle shown in FIG. 3. That is, in the second active cycle in FIG. 5, the even sense enable signals are initially enabled at time t2, and the odd sense enable signals are enabled later at time t3. The first active cycle ("even bitline stress" condition) illustrates the reverse scenario where the odd sense enable signals are first enabled at time t2, and the even sense enable signals are enabled later at time t3. Each of the first and second active cycles are described in more detail next using the circuit diagrams in FIGS. 4A, 4B, 5 and 6.

When the first active cycle starts at time t1, the even test mode signal TM_SAEN_E is high and thus the memory device is in test mode. For the duration that the TM_SAEN_E signal is high (this is highlighted by the box marked by reference numeral 502), even sense enable signals SAN_E, SAP1_E and SAP2_E are forced low (this is highlighted by the box marked by reference numeral 504). The odd test mode signal TM_SAEN_O is low during the entire first active cycle, thus allowing the odd sense enable signals SAN_O, SAP1_O and SAP2_O to transition in a normal fashion.

Similarly, when the second active cycle starts at time t1, the odd test mode signal TM_SAEN_O is high and thus the memory device is in test mode. For the duration that the TM_SAEN_O signal is high (this is highlighted by the box marked by reference numeral 506), odd sense enable signals SAN_O, SAP1_O and SAP2_O are forced low (this is highlighted by the box marked by reference numeral 508). The even test mode signal TM_SAEN_E is low during the entire second active cycle, thus allowing the even sense enable signals SAN_E, SAP1_E and SAP2_E to transition in a normal fashion.

The operation of the logic circuits in FIGS. 4A and 4B for generating the sense enable signals as shown in FIG. 5 is quite simple in light of the above description and thus will not be described herein. It is noted that blocks 402A-402C in FIG. 4A and blocks 403A-403C in FIG. 4B marked as CRLS_VD-DVPP function as level shifter circuits. These circuits convert VDD level signals at their input to higher VPP level signals at their outputs.

Figure 6:
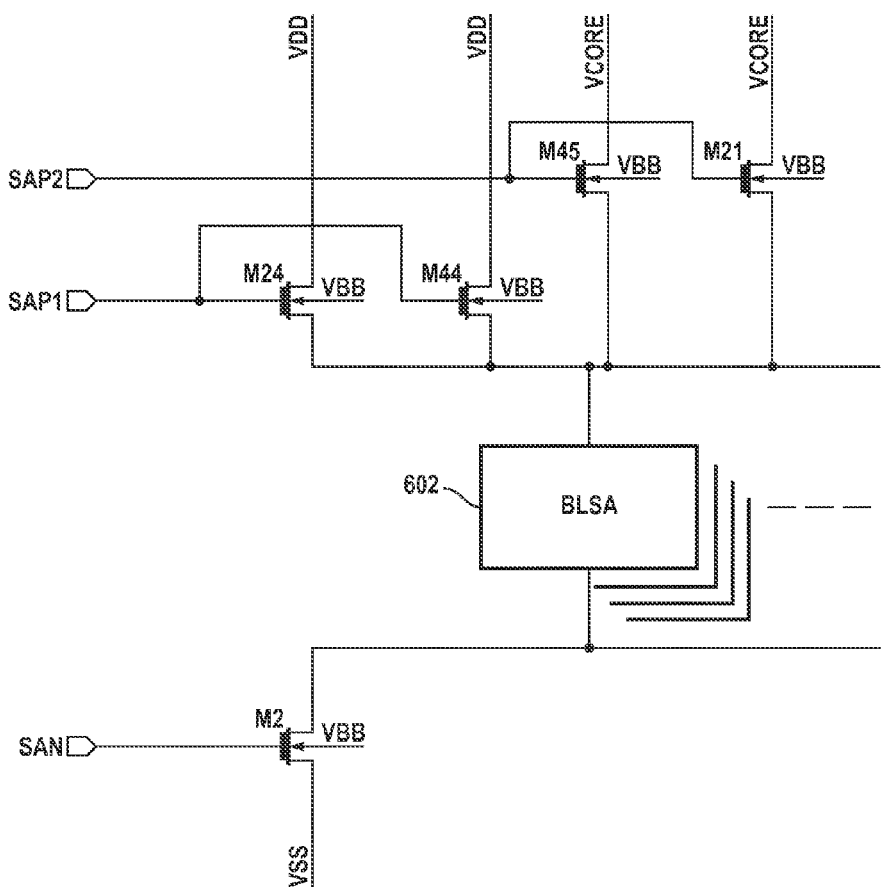
FIG. 6 shows details of a sense amplifier circuit used in sense amplifier blocks SA_E 106A and SA_O 106B in FIG. 1C.

The even and odd sense enable signals SAN_E/O, SAP1_E/O and SAP2_E/O generated by the circuits in FIGS. 4A and 4B are coupled to corresponding sense amplifier circuits in SA_E and SA_O blocks 106A, 106B in FIG. 1C in the manner shown in FIG. 6. Bitline sense amplifier circuits BLSA 602 correspond to sense amplifier circuits such as circuits 122, 124, 126, 128 in FIG. 1B. Bitline sense amplifier circuits BLSA 602 are connected to power supply VDD through two n-channel transistors M24 and M44, the gates of which are controlled by the SAP1 signal. BLSA circuits 602 are also connected to VCORE voltage through two n-channel transistors M21 and M45, the gates of which are controlled by the SAP2 signal. BLSA circuits 602 are further connected to the ground potential VSS through n-channel transistor M2, the gate of which is controlled by SAN signal. Signal names SAP1, SAP2 and SAN in FIG. 6 would have an "O" or "E" designation corresponding to the SA_O or SA_E blocks to which they are coupled to.

When SAP1_E/O rises, the VDD supply is provided to corresponding BLSA circuits 602 through transistors M24 and M44. When SAP2_E/O rises, core voltage VCORE is provided to corresponding BLSA circuits 602 through transistors M45 and M21. When SAN rises, ground potential VSS is provided to corresponding BLSA circuits 602 through transistor M2. At least one of VDD and VCORE need to be supplied together with VSS to BLSA circuits in order to enable the BLSA circuits to sense and amplify the signals on the bitlines to which they are connected. As the timing diagram in FIG. 5 shows, where BLSA circuits 602 are to be enabled in a normal mode of operation, SAN and SAP1 are initially raised high to supply VDD and VSS to corresponding BLSA circuit. This corresponds to, for example, time t2 in the first active cycle when SAN_O and SAP1_O are raised high while SAP2_O is kept low. At a later time in the active cycle, SAP1 is brought low and SAP2 is raised high while SAN signal is kept in the high state to thereby supply VCORE and VSS to the BLSA circuits. This corresponds to the timing just before t3 in the first active cycle in FIG. 5 when SAP1_O is brought low and SAP2_O is raised high while SAN_O is kept high.

Where BLSA circuits are to be enabled in the test mode, all of SAN, SAP1 and SAP2 are forced to remain in the low state until time t3 when only SAN and SAP2 are raised high to thereby supply VCORE and VSS to BLSA circuits. In this manner, the initial sensing that is normally performed at time t2 in a normal mode is prevented thus delaying the sensing operation by the time period defined by the time period between t2 to t3.

In FIG. 6, signal SAP1 rises to a voltage level greater than VDD in order to allow transistors M24 and M44 to supply the full VDD voltage to BLSA circuits 602. Similarly, SAP2 rises to a voltage level greater than VCORE in order to allow transistors M45 and M21 to supply the full VCORE voltage to BLSA circuits 602.

The circuit implementation for the bridge screen test can be designed so that the time delay between enabling the even and odd sense amplifiers is fixed or is externally controlled. For example, a test mode register on the memory device may be used to enable entry into the bridge screen test mode. The test mode register may store one or multiple delay values that can be externally selected during the test mode. Alternatively, once the test mode is entered via the test mode register, an external pin may be used to vary the amount of delay between enabling the even and odd sense amplifiers. For example, the TM_SAEN_E and TM_SAEN_O signals in FIG. 5 may be provided by a tester or generated internally in the memory device.

While the bridge screen test technique is described in the context of the specific array architecture shown in FIGS. 1B and 1C, the bridge screen test technique can also be implemented in other array architectures such as the well-known folded bitline architecture wherein the complementary signals provided to each sense amplifier are supplied by two bitlines located in the same memory array (mat) as opposed to two different arrays (mats) as shown in FIGS. 1B and 1C. The timing diagrams shown in FIGS. 2, 3 and 5 similarly apply in folded bitline architecture.

What is claimed is:

1. A method for detecting a bridge between two memory cells in a memory array having a plurality of memory cells coupled to wordlines and bitlines, the method comprising:
   receiving a test mode command; and
   in response to an active command, enabling a first sense amplifier and a second sense amplifier for respectively sensing a state of a first memory cell and a second memory cell;
   wherein the first and second memory cells are adjacent one another, and the test mode command causes the second sense amplifier to be enabled a predetermined amount of time after the first sense amplifier is enabled.

2. The method of claim 1 wherein the predetermined amount of time allows the detection of a bridge between the first and second memory cells.

3. The method of claim 1 wherein in a normal mode of operation, the first and second sense amplifiers are enabled at substantially the same time.

4. The method of claim 1 further comprising:
   selecting a wordline in response to the active command, each of the first and second memory cells having a gate connected to the selected wordline.

5. The method of claim 1 further comprising,
   writing opposite data into the first and second memory cells prior to enabling the first sense amplifier.

6. The method of claim 1 wherein a first bitline couples the first memory cell to the first sense amplifier, and a second bitline couples the second memory cell to the second sense amplifier, and prior to receiving the active command, the first and second bitlines are precharged to a precharge voltage level.

7. The method of claim 6 further comprising:
selecting a wordline in response to the active command, each of the first and second memory cells having a gate connected to the wordline,
wherein in response to the selection of the wordline, the first memory cell causes the first bitline to have a first voltage level, and the second memory cell causes the second bitline to have a second voltage level, wherein the first and second voltage levels are opposite one another relative to the precharge voltage level.

8. The method of claim 6 wherein during the time period between enabling the first and second sense amplifiers, a voltage difference between a voltage level on the first bitline and the precharge voltage level is increased.

9. The method of claim 6 wherein during the time period between enabling the first and second sense amplifiers, a voltage difference between the voltage level on the second bitline and the precharge voltage level is reduced if a bridge between the first and second memory cells is present.

10. The method of claim 1 wherein the memory array is housed in a memory device and the predetermined amount of time is controlled external to the memory device.

11. The method of claim 1 wherein the memory array is housed in a memory device and the predetermined amount of time is internally selected from a number of preset delays.

12. A semiconductor memory comprising:
a memory array having a plurality of memory cells coupled to wordlines and bitlines;
a circuit block configured to receive a test mode command;
a first sense amplifier coupled to sense and amplify a state of a first memory cell when enabled; and
a second sense amplifier coupled to sense and amplify a state of a second memory cell when enabled, the first and second memory cells being adjacent one another,
wherein in an active cycle, the circuit block generates one or more control signals in response to the test mode command that cause the second sense amplifier to be enabled a predetermined amount of time after the first sense amplifier is enabled.

13. The semiconductor memory of claim 12 wherein the predetermined amount of time allows the detection of a bridge between the first and second memory cells.

14. The semiconductor memory of claim 12 wherein in a normal mode of operation, the first and second sense amplifiers are enabled at substantially the same time.

15. The semiconductor memory of claim 12 wherein the first and second memory cells are connected to a wordline which is selected in the active cycle.

16. The semiconductor memory of claim 12 wherein prior to enabling the first sense amplifier, opposite data is written into the first and second memory cells.

17. The semiconductor memory of claim 12 further comprising:
a first bitline coupling the first memory cell to the first sense amplifier; and
a second bitline coupling the second memory cell to the second sense amplifier,
wherein prior to the active cycle, the first and second bitlines are precharged to a precharge voltage level.

18. The semiconductor memory of claim 17 wherein the first and second memory cells are connected to a wordline which is selected in the active cycle, and in response to the selection of the wordline, the first and second memory cells cause the first and second bitlines to respectively have first and second voltage levels opposite one another relative to the precharge voltage level.

19. The semiconductor memory of claim 17 wherein during the time period between enabling the first and second sense amplifiers, the first sense amplifier causes a voltage difference between a voltage level on the first bitline and the precharge voltage level to increase.

20. The semiconductor memory of claim 17 wherein during the time period between enabling the first and second sense amplifiers, a voltage difference between the voltage level on the second bitline and the precharge voltage level is reduced if a bridge between the first and second memory cells is present.

21. The semiconductor memory of claim 17 wherein the semiconductor memory is housed in a memory device and the predetermined amount of time is controlled external to the memory device.

22. The semiconductor memory of claim 17 wherein the semiconductor memory is housed in a memory device and the predetermined amount of time is internally selected from a number of preset delays.

* * * * *